(12) United States Patent
Shin et al.

(10) Patent No.: US 12,080,721 B2
(45) Date of Patent: Sep. 3, 2024

(54) DISPLAY SUBSTRATE, MANUFACTURING METHOD THEREFOR, AND DISPLAY DEVICE INCLUDING SAME

(71) Applicant: Samsung Display Co., LTD., Yongin-si (KR)

(72) Inventors: Hyun-Eok Shin, Gwacheon-si (KR); Hong-Sick Park, Yeongtong-gu (KR); Sangwoo Sohn, Yongin-si (KR); Sang-Gab Kim, Seoul (KR); Gyungmin Baek, Yongin-si (KR); Sang-Won Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 586 days.

(21) Appl. No.: 17/264,255

(22) PCT Filed: Mar. 29, 2019

(86) PCT No.: PCT/KR2019/003692
§ 371 (c)(1),
(2) Date: Jan. 28, 2021

(87) PCT Pub. No.: WO2020/027402
PCT Pub. Date: Feb. 6, 2020

(65) Prior Publication Data
US 2021/0296364 A1 Sep. 23, 2021

(30) Foreign Application Priority Data
Jul. 30, 2018 (KR) ........................ 10-2018-0088429

(51) Int. Cl.
*H01L 27/12* (2006.01)
*H01L 27/32* (2006.01)
*H10K 59/131* (2023.01)

(52) U.S. Cl.
CPC ........ *H01L 27/124* (2013.01); *H01L 27/1259* (2013.01); *H10K 59/131* (2023.02); *H01L 27/1218* (2013.01)

(58) Field of Classification Search
CPC ...... H10K 19/202; H10K 19/20; H10K 19/80; H10K 30/82; H10K 30/85; H10K 30/86;
(Continued)

(56) References Cited

U.S. PATENT DOCUMENTS

| | | | |
|---|---|---|---|
| 7,306,988 B1 * | 12/2007 | Avanzino | H10N 70/8833 438/387 |
| 7,846,839 B2 | 12/2010 | Kojima et al. | |
| 9,236,403 B2 | 1/2016 | Kim et al. | |
| 9,911,939 B2 | 3/2018 | Shin et al. | |
| 10,290,742 B2 | 5/2019 | Yamazaki et al. | |
| 2011/0177692 A1 * | 7/2011 | Wang | H01L 21/67069 438/704 |
| 2011/0221012 A1 * | 9/2011 | Bu | H01L 29/78 257/411 |

(Continued)

FOREIGN PATENT DOCUMENTS

| | | |
|---|---|---|
| KR | 10-2008-0106373 | 12/2008 |
| KR | 10-2013-0089419 | 8/2013 |

(Continued)

*Primary Examiner* — Cuong B Nguyen
*Assistant Examiner* — Anthony A Pulatov
(74) *Attorney, Agent, or Firm* — Lewis Roca Rothgerber Christie LLP (57) ABSTRACT

A display substrate may include a substrate and a wiring on the substrate. The wiring may include a metal oxide layer including at least one oxide selected from tantalum (Ta), niobium (Nb), and titanium (Ti), and a metal layer on the metal oxide layer and including copper (Cu), and a thickness of the metal oxide layer may be in a range of about 30 angstroms (Å) to about 50 Å.

14 Claims, 8 Drawing Sheets

(58) Field of Classification Search
CPC .... H10K 30/88; H10K 50/167; H10K 50/157; H10K 50/8445; H10K 50/87; H10K 50/818; H10K 59/80517; H10K 59/80523; H10K 59/1315; H10K 85/146; H10K 2102/361; H10K 10/46–491; H01L 21/02172–02197; H01L 21/3205–32053; H01L 22/12; H01L 29/4908; H01L 29/517; H01L 29/7869; H01L 29/66742–6678; H01L 29/786–78696; H01L 29/04–045; H01L 29/16–1608; H01L 29/18–185; H01L 29/22–2206; H01L 29/36–365; H01L 33/00–648; H01L 27/15–156; H01L 27/12–13; H01L 2933/00–0091; H01L 2924/13069

See application file for complete search history.

(56) References Cited

U.S. PATENT DOCUMENTS

| | | |
|---|---|---|
| 2013/0200382 A1 | 8/2013 | Kim et al. |
| 2013/0240873 A1 | 9/2013 | Yamazaki et al. |
| 2015/0263174 A1* | 9/2015 | Yamazaki ......... H01L 29/78621 257/43 |
| 2017/0018577 A1* | 1/2017 | Matsuda ............... H01L 29/045 |
| 2017/0090229 A1* | 3/2017 | Imai .................. H01L 29/78633 |

FOREIGN PATENT DOCUMENTS

| | | | |
|---|---|---|---|
| KR | 10-2013-0105392 | 9/2013 | |
| KR | 10-2015-0006685 | 1/2015 | |
| KR | 10-2018-0014171 | 2/2018 | |
| WO | WO-2010093237 A1 * | 8/2010 | ........... H01L 51/441 |

* cited by examiner

DISPLAY SUBSTRATE, MANUFACTURING METHOD THEREFOR, AND DISPLAY DEVICE INCLUDING SAME

CROSS-REFERENCE TO RELATED APPLICATIONS

This application is a U.S. National Phase Patent of International Application Number PCT/KR2019/003692, filed on Mar. 29, 2019, which claims priority to Korean Patent Application Number 10-2018-0088429, filed on Jul. 30, 2018, the entire content of each of which is hereby incorporated by reference.

FIELD

Embodiments of the present relate to a display device. For example, embodiments of the present disclosure relate to a display substrate including a wiring, a method of manufacturing the display substrate, and an organic light emitting display device including the display substrate.

BACKGROUND

In general, a thin film transistor (TFT) may be used as a switching element for independently driving each pixel in a flat panel display device such as a liquid crystal display (LCD) and an organic light emitting display (OLED). In addition to the thin film transistor and a pixel electrode coupled thereto, a display substrate including the thin film transistor may include various wirings such as a gate wire configured to transmit a gate signal to the thin film transistor and a data wire configured to transmit a data voltage.
As an area of the display device including such a display substrate becomes larger, a length of the wiring may become longer, so that it is necessary to form the wiring by using a material having a low resistance. In order to increase a transmission speed of the wiring, copper (Cu) and/or the like having a relatively low resistance may be used as a material of the wiring.

However, when copper is used as the material of the wiring, a copper layer may be easily peeled off because adhesive strength between the copper layer and a substrate is poor, so that defects may occur in the gate wire. Meanwhile, when a titanium (Ti) layer is formed between the copper layer and the substrate in order to increase the adhesive strength between the copper layer and the substrate, copper may be diffused into the titanium layer in a high-temperature process during a process of manufacturing the display substrate, so that a resistance of the wiring may be increased.

SUMMARY

An aspect of embodiments of the present disclosure provides a display substrate including a wiring having a relatively lower resistance.

An aspect of embodiments of the present disclosure prevents or reduces an increase in a resistance of a wiring during a manufacturing process of a display substrate.

In order to achieve aspects of embodiments of the present disclosure described above, a display substrate may include a substrate and a wiring on the substrate. The wiring may include a metal oxide layer including at least one oxide selected from tantalum (Ta), niobium (Nb), and titanium (Ti), and a metal layer on the metal oxide layer and including copper (Cu), and a thickness of the metal oxide layer may be in a range of about 30 angstroms (Å) to about 50 Å.

In an embodiment, a side surface of the metal oxide layer may be continuously formed from a side surface of the metal layer.

In an embodiment, the metal layer may be directly on the metal oxide layer.

In an embodiment, the wiring may further include an intermetallic compound layer between the metal oxide layer and the metal layer.

In an embodiment, a thickness of the intermetallic compound layer may be less than or equal to about 30 Å.

In an embodiment, the intermetallic compound layer may include an intermetallic compound including at least one selected from tantalum, niobium, and titanium, and copper.

In an embodiment, a side surface of the metal oxide layer, a side surface of the intermetallic compound layer, and a side surface of the metal layer may be continuously formed.

In an embodiment, a thickness of the metal layer may be in a range of about 500 Å to about 5000 Å.

In an embodiment, the substrate includes silicon oxide ($SiO_x$).

In order to achieve aspects of embodiments of the present disclosure described above, a method for manufacturing a display substrate may include sequentially stacking a first metal layer including at least one selected from tantalum (Ta), niobium (Nb), and titanium (Ti) and a second metal layer including copper (Cu) on a substrate, forming a wiring by partially etching the first metal layer and the second metal layer, and converting the first metal layer into a metal oxide layer by oxidation.

In an embodiment, the first metal layer may be converted into the metal oxide layer by natural oxidation.

In an embodiment, a thickness of the metal oxide layer may be in a range of about 30 angstroms (Å) to about 50 Å.

In an embodiment, the first metal layer may be entirely converted into the metal oxide layer by the oxidation.

In an embodiment, the first metal layer may be partially converted into the metal oxide layer by the oxidation.

In an embodiment, the method may further include converting a remaining part of the first metal layer, which is not oxidized, into an intermetallic compound layer by allowing the remaining part of the first metal layer to react with the second metal layer.

In an embodiment, a thickness of the intermetallic compound layer may be less than or equal to about 30 Å.

In an embodiment, the converting of the remaining part of the first metal layer into the intermetallic compound layer may be performed after the first metal layer is partially converted into the metal oxide layer.

In order to achieve aspects of embodiments of the present disclosure described above, a display device may include a substrate, a gate wire on the substrate, a thin film transistor including an active pattern, and a gate electrode overlapping the active pattern and protruding from the gate wire, and a light emitting element coupled to the thin film transistor. The gate wire may include a metal oxide layer including at least one oxide selected from tantalum (Ta), niobium (Nb), and titanium (Ti), and a metal layer on the metal oxide layer and including copper (Cu), and a thickness of the metal oxide layer may be about 30 angstroms (Å) to about 50 Å.

In an embodiment, a side surface of the metal oxide layer may be continuously formed from a side surface of the metal layer.

In an embodiment, the metal layer may be directly on the metal oxide layer.

The wiring of the display substrate according to the embodiments may include the metal oxide layer including at least one oxide selected from tantalum (Ta), niobium (Nb), and titanium (Ti), and the metal layer on the metal oxide layer and including copper (Cu), and the thickness of the metal oxide layer may be in a range of about 30 Å to about 50 Å. Accordingly, the wiring of the display substrate may have a relatively low resistance.

In the method of manufacturing the display substrate according to the embodiments, the first metal layer including at least one selected from tantalum (Ta), niobium (Nb), and titanium (Ti) and the second metal layer including copper (Cu) may be sequentially stacked on the substrate, and the first metal layer may be converted into the metal oxide layer by natural oxidation. Therefore, an additional process for converting the first metal layer into the metal oxide layer in the formation of the wiring may not be required.

DETAILED DESCRIPTION

Hereinafter, display substrates, methods of manufacturing display substrates, and display devices in accordance with embodiments of the present disclosure will be explained in more detail with reference to the accompanying drawings.

Hereinafter, a configuration of a display substrate according to one embodiment of the present disclosure will be described with reference to FIGS. 1 and 2.

Figure 1:
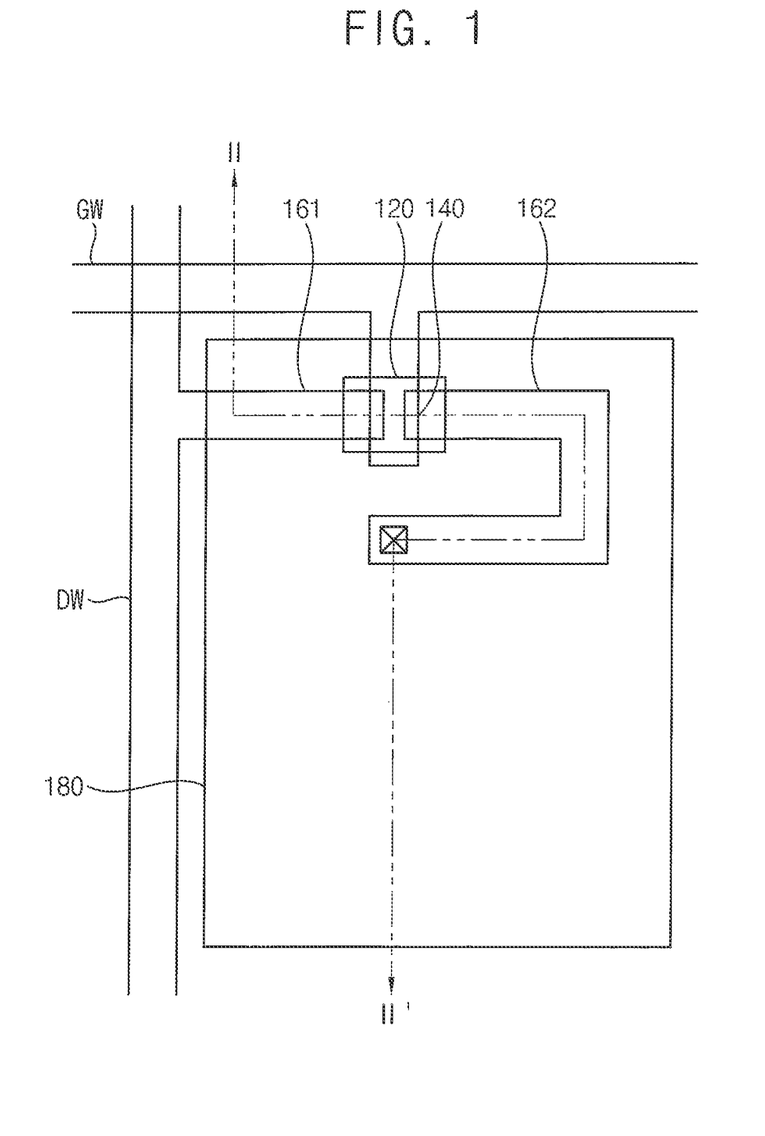
FIG. 1 is a layout view showing a display substrate according to one embodiment of the present disclosure.

FIG. 1 is a layout view showing a display substrate according to one embodiment of the present disclosure. FIG. 2 is a cross-sectional view showing the display substrate according to one embodiment of the present disclosure. For example, FIG. 2 may be a cross-sectional view taken along line II-II' of the display substrate of FIG. 1.

Figure 2:
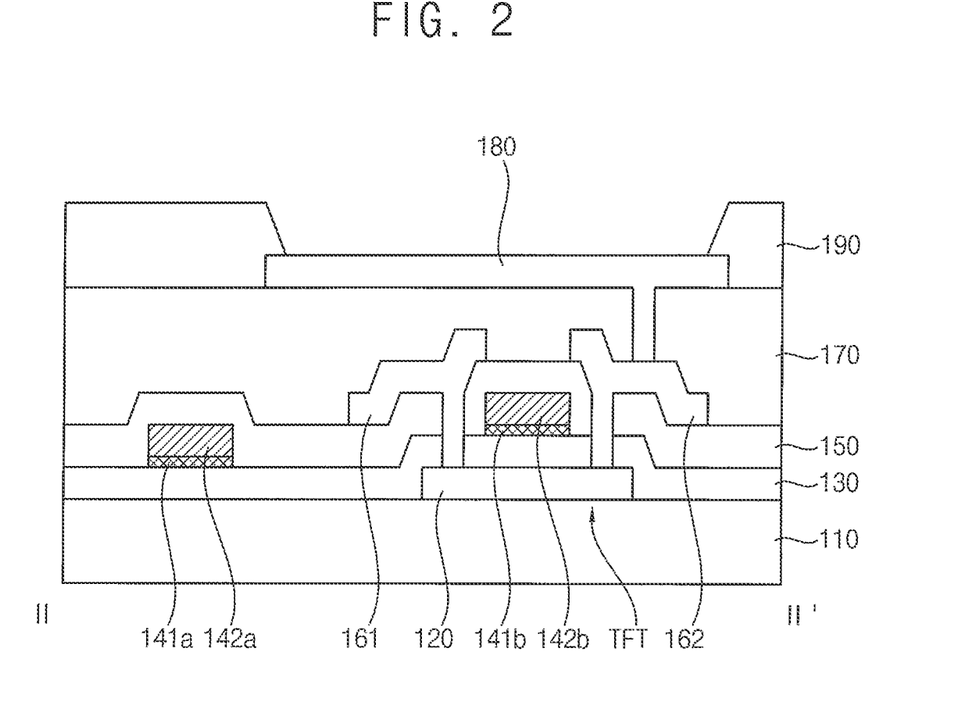
FIG. 2 is a cross-sectional view showing the display substrate according to one embodiment of the present disclosure.

Referring to FIGS. 1 and 2, according to one embodiment of the present disclosure, a display substrate may include a substrate 110, a thin film transistor TFT and wirings such as a gate wire GW and a data wire on the substrate 110, and a pixel electrode 180 coupled to the thin film transistor TFT. Although only one thin film transistor has been shown in FIGS. 1 and 2, at least two thin film transistors may be included for each pixel. For example, a switching thin film transistor and a driving thin film transistor may be included for each pixel. A capacitor may be electrically coupled between the switching thin film transistor and the driving thin film transistor.

A transparent insulating substrate may be used as the substrate 110. For example, the substrate 110 may include glass including silicon oxide ($SiO_x$) and/or the like.

An active pattern 120 may be on the substrate 110. In some embodiments, a buffer layer or the like may be between the substrate 110 and the active pattern 120 to block or reduce diffusion of impurities through the substrate 110.

In one embodiment, the active pattern 120 may include a silicon compound such as polycrystalline silicon. A source region and a drain region including p-type or n-type impurities may be formed at both ends of the active pattern 120, respectively. In another embodiment, the active pattern 120 may include an oxide semiconductor such as indium gallium zinc oxide (IGZO), zinc tin oxide (ZTO), and/or indium tin zinc oxide (ITZO).

A gate insulating layer 130 may be on the substrate 110 to cover the active pattern 120. The gate insulating layer 130 may include silicon oxide ($SiO_x$), silicon nitride ($SiN_x$), silicon oxynitride ($SiO_xN_y$), and/or the like.

A gate wire GW may be on the gate insulating layer 130. The gate wire GW may transmit a gate signal, and may extend in a row direction. The gate wire GW may include a gate electrode 140 having a shape protruding from the gate wire GW.

The gate wire GW may include metal oxide layers 141a and 141b, and metal layers 142a and 142b on the metal oxide layers 141a and 141b.

The metal oxide layers 141a and 141b may include at least one oxide selected from tantalum (Ta), niobium (Nb), and titanium (Ti). For example, the metal oxide layers 141a and 141b may include tantalum pentoxide ($Ta_2O_5$), niobium pentoxide ($Nb_2O_5$), and/or titanium dioxide ($TiO_2$). The metal layers 142a and 142b may include a metal having a low resistance, such as copper (Cu).

An interlayer insulating layer 150 may be on the gate insulating layer 130 to cover the gate wire GW. The interlayer insulating layer 150 may include silicon oxide, silicon nitride, silicon oxynitride, and/or the like.

A data wire DW and a drain electrode 162 may be on the interlayer insulating layer 150. The data wire DW may transmit a data voltage, and may extend in a column direction to cross (e.g., intersect) the gate wire GW. The data wire DW may include a source electrode 161 having a shape protruding from the data wire DW. The drain electrode 162 may be separated from the data wire DW, and may face the source electrode 161 with the gate electrode 140 interposed therebetween. The source electrode 161 and the drain electrode 162 may pass through the interlayer insulating layer 150 and the gate insulating layer 130 to make contact (e.g., physical contact) with the active pattern 120.

The data wire DW and the drain electrode 162 may include a metal such as aluminum (Al), silver (Ag), tungsten (W), copper (Cu), nickel (Ni), chromium (Cr), molybdenum (Mo), titanium (Ti), platinum (Pt), tantalum (Ta), niobium (Nb), and/or scandium (Sc), an alloy of the metal, and/or a nitride of the metal. For example, the data wire DW and the drain electrode 162 may have a structure in which two or more mutually different metal layers such as an Al layer and a Ti layer are stacked.

The thin film transistor TFT may be defined by the active pattern 120, the gate insulating layer 130, the gate electrode 140, the source electrode 161, and the drain electrode 162 described above. Although a thin film transistor having a top gate structure in which the gate electrode 140 is on the active pattern 120 has been shown in FIG. 2, the thin film transistor TFT may have a bottom gate structure in which the gate electrode 140 is under the active pattern 120.

A protective layer 170 may be on the interlayer insulating layer 150 to cover the data wire DW and the drain electrode 162. The protective film 170 may include an inorganic insulating material such as silicon oxide, silicon nitride, and/or silicon oxynitride, and/or an organic insulating material such as polyimide, an epoxy-based resin, an acryl-based resin, and/or polyester.

The pixel electrode 180 may be on the protective layer 170. The pixel electrode 180 may pass through the protective layer 170 to make contact (e.g., physical contact) with the drain electrode 162. In one embodiment, the pixel electrode 180 may be independently included for each pixel.

In one embodiment, the pixel electrode 180 may be provided as a reflective electrode. In this case, the pixel electrode 180 may include a metal such as Al, Ag, W, Cu, Ni, Cr, Mo, Ti, Pt, Ta, Nb, and/or Sc, and/or an alloy of the metal. In addition, the pixel electrode 180 may include a transparent conductive material having a high work function. For example, the pixel electrode 180 may include indium tin oxide (ITO), indium zinc oxide (IZO), zinc oxide, and/or indium oxide. In one embodiment, the pixel electrode 180 may have a multilayer structure including the metal and the transparent conductive material.

A pixel defining layer 190 may be on the protective layer 170 to cover a periphery of the pixel electrode 180. The pixel defining layer 190 may include a transparent organic material such as a polyimide resin and/or an acryl resin.

Hereinafter, a wiring structure of the display substrate according to one embodiment of the present disclosure will be described with reference to FIG. 3.

Figure 3:
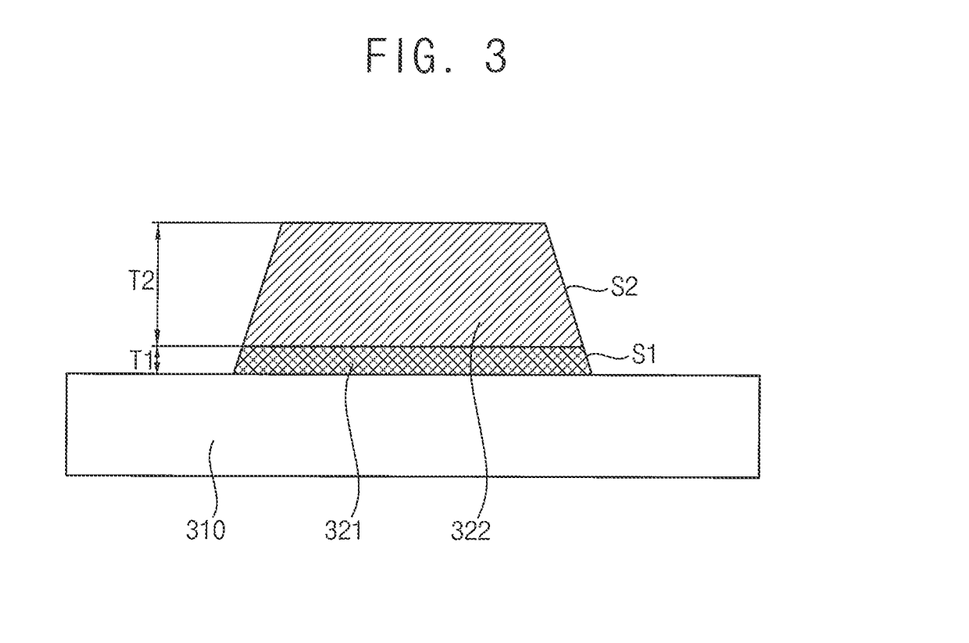
FIG. 3 is a cross-sectional view showing a wiring of the display substrate according to one embodiment of the present disclosure.

FIG. 3 is a cross-sectional view showing a wiring of the display substrate according to one embodiment of the present disclosure. For example, the wiring of FIG. 3 may represent the gate wire GW of the display substrate according to one embodiment of the present disclosure shown in FIGS. 1 and 2.

Referring to FIG. 3, as described above, according to one embodiment of the present disclosure, the gate wire GW of the display substrate may include a metal oxide layer 321 and a metal layer 322 that are sequentially stacked on a base layer 310. The base layer 310 may be the substrate 110 or the gate insulating layer 130 in FIG. 2.

The metal layer 322 may be directly on (e.g., physically contacting) the metal oxide layer 321. In other words, a bottom surface of the metal layer 322 may make contact (e.g., physical contact) with a top surface of the metal oxide layer 321.

A side surface S1 of the metal oxide layer 321 may be continuously formed from a side surface S2 of the metal layer 322. In other words, the side surface S1 of the metal oxide layer 321 and the side surface S2 of the metal layer 322 may extend toward the base layer 310 without a step therebetween.

The metal layer 322 may allow the gate wire GW to have a low resistance, and the metal oxide layer 321 may improve adhesive strength between the metal layer 322 and the base layer 310. In addition, the metal oxide layer 321 may prevent or reduce diffusion of a material of the metal layer 322 downward to react with the base layer 310, so that corrosion and defects of the gate wire GW may be prevented or reduced.

A thickness T1 of the metal oxide layer 321 may be in a range of about 30 angstroms (Å) to about 50 Å. When the thickness T1 of the metal oxide layer 321 is less than about 30 Å, the metal oxide layer 321 may not sufficiently prevent the material of the metal layer 322 from diffusing downward. In some embodiments, a thickness T2 of the metal layer 322 may be in a range of about 500 Å to about 5000 Å. When the thickness T2 of the metal layer 322 is less than about 500 Å, a resistance of the metal layer 322 may be increased, so that the gate wire GW may have a relatively high resistance. In addition, when the thickness T2 of the metal layer 322 is greater than about 5000 Å, a step coverage of an insulating layer that covers the gate wire GW may be poor.

Hereinafter, a method for manufacturing a display substrate according to one embodiment of the present disclosure will be described with reference to FIGS. 4 to 8 and FIGS. 1 and 2 described above.

FIGS. 4, 5, 6, 7, and 8 are cross-sectional views showing a method for manufacturing a display substrate according to one embodiment of the present.

Figure 4:
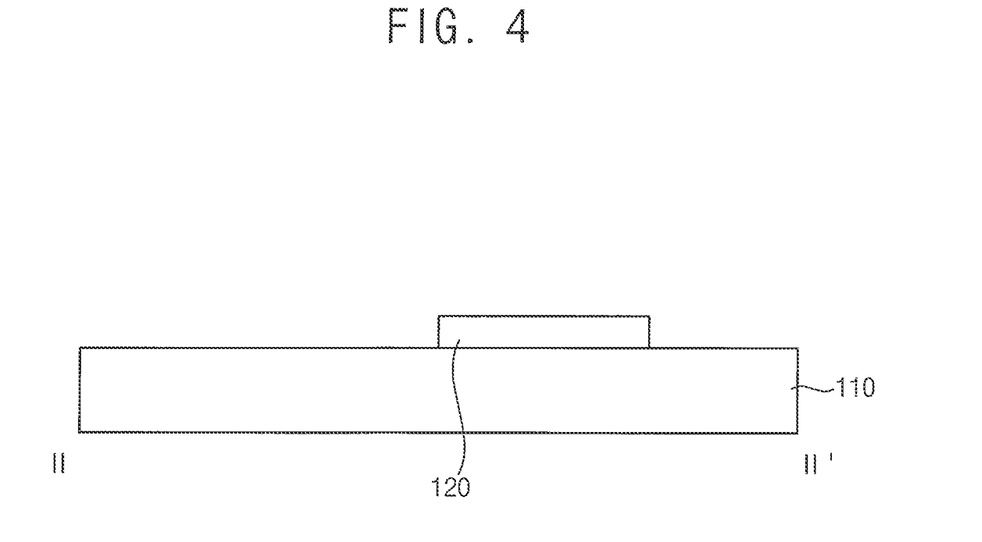
FIGS. 4, 5, 6, 7, and 8 are cross-sectional views showing a method for manufacturing a display substrate according to one embodiment of the present disclosure.

Referring to FIG. 4, the active pattern 120 may be formed on the substrate 110. For example, the active pattern 120 may be formed by depositing a semiconductor layer on the substrate 110 through sputtering and/or the like, and partially etching the semiconductor layer through a photolithography process and/or the like.

Figure 5:
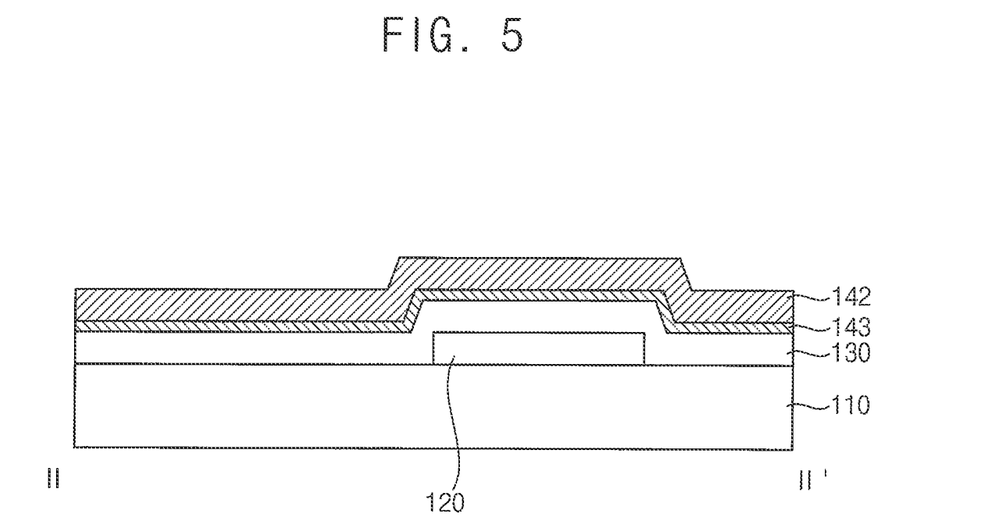

Referring to FIG. 5, a first metal layer 143 and a second metal layer 142 may be sequentially stacked on the substrate 110.

First, the gate insulating layer 130 may be formed on the substrate 110 to cover the active pattern 120. For example, the gate insulating layer 130 may be deposited on the substrate 110 through chemical vapor deposition (CVD) and/or the like.

Thereafter, the first metal layer 143 may be formed on the gate insulating layer 130, and the second metal layer 142 may be formed on the first metal layer 143. For example, the first metal layer 143 including at least one selected from tantalum, niobium, and titanium may be deposited on the gate insulating layer 130 through the sputtering and/or the like, and the second metal layer 142 including copper may be deposited on the first metal layer 143 through the sputtering and/or the like.

A thickness of the first metal layer 143 may be in a range of about 30 Å to about 50 Å. As described above, because the thickness of the first metal layer 143 is greater than or equal to about 30 Å, downward diffusion of a material of the second metal layer 142 may be sufficiently prevented or reduced. In addition, a thickness of the second metal layer 142 may be in a range of about 500 Å to about 5000 Å. As described above, because the thickness of the second metal layer 142 is greater than or equal to about 500 Å, the second metal layer 142 may have a relatively low resistance. Because the thickness of the second metal layer 142 is less than or equal to about 5000 Å, deterioration of a step coverage of an insulating layer formed on the second metal layer 142 in a subsequent process may be prevented or reduced.

Figure 6:
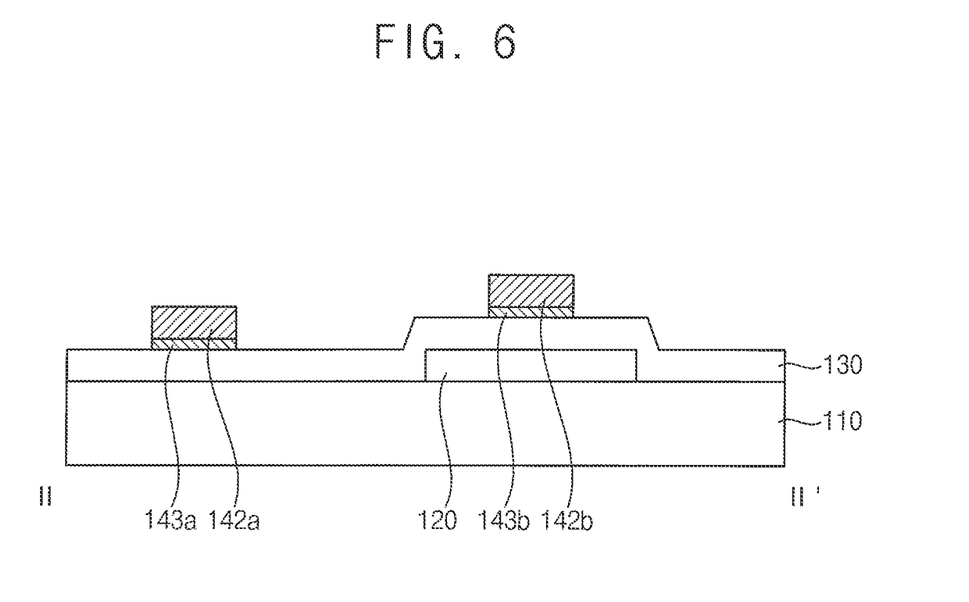

Referring to FIGS. 1 and 6, the gate wire GW may be formed by partially etching the first metal layer 143 together with the second metal layer 142. For example, the first metal layer 143 and the second metal layer 142 may be partially etched through the photolithography process and/or the like using wet etching. The gate wire GW may include lower metal layers 143a and 143b obtained by partially etching the first metal layer 143, and upper metal layers 142a and 142b obtained by partially etching the second metal layer 142. Because the first metal layer 143 is partially etched together with the second metal layer 142, side surfaces of the upper metal layers 142a and 142b may be consecutive to (e.g., aligned with) side surfaces of the lower metal layers 143a and 143b, respectively.

Figure 7:
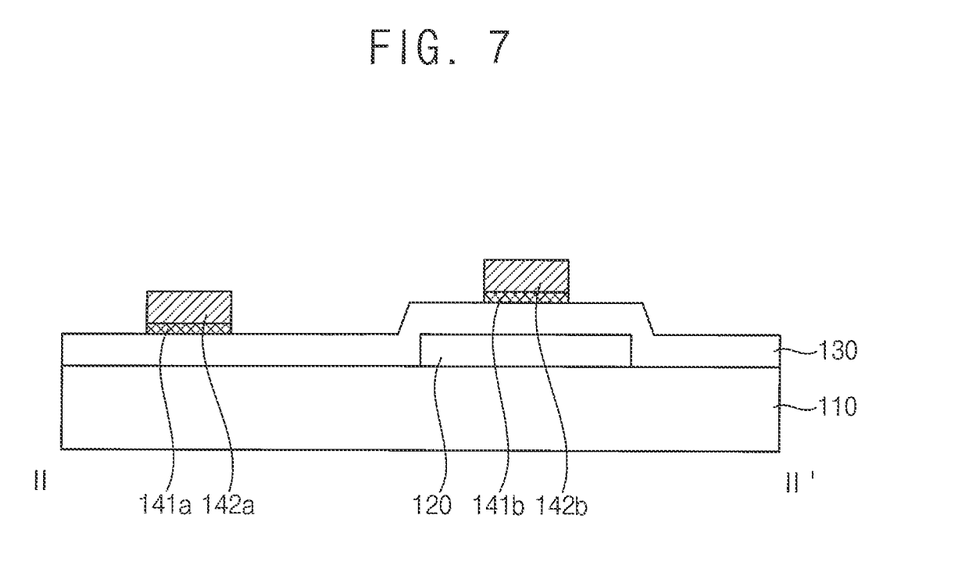

Referring to FIG. 7, the lower metal layers 143a and 143b may be converted into metal oxide layers 141a and 141b through oxidation.

In one embodiment, the lower metal layers 143a and 143b may be converted into the metal oxide layers 141a and 141b through natural oxidation. For example, when oxygen and/or moisture included in the substrate 110 and/or the gate insulating layer 130 are introduced into the lower metal layers 143a and 143b, the lower metal layers 143a and 143b may be converted into the metal oxide layers 141a and 141b due to the oxygen and/or the moisture. Accordingly, an additional process for oxidizing the lower metal layers 143a and 143b may not be required.

In one embodiment, the lower metal layers 143a and 143b may be entirely converted into the metal oxide layers 141a and 141b through the oxidation. The lower metal layers 143a and 143b may be oxidized by the oxygen and/or the moisture included in the substrate 110 and/or the gate insulating layer 130 under the lower metal layers 143a and 143b, and a thickness of each of the oxidized lower metal layers 143a and 143b may be less than or equal to about 50 Å from a bottom surface of each of the lower metal layers 143a and 143b. As described above, because the thickness of the first metal layer 143 is less than or equal to about 50 Å, the lower metal layers 143a and 143b may be entirely (e.g., substantially entirely) converted into the metal oxide layers 141a and 141b through the oxidation.

Figure 8:
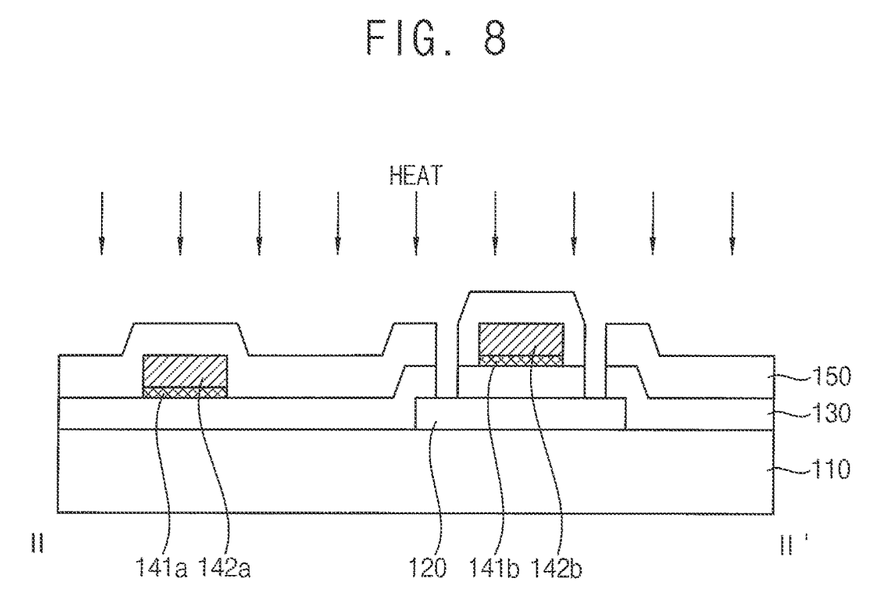

Referring to FIG. 8, after the lower metal layers 143a and 143b are converted into the metal oxide layers 141a and 141b through the oxidation, the active pattern 120 may be subject to a heat treatment.

First, the interlayer insulating layer 150 may be formed on the gate insulating layer 130 to cover the gate wire GW. For example, the interlayer insulating layer 150 may be deposited on the gate insulating layer 130 through the chemical vapor deposition and/or the like. In addition, a contact hole that partially exposes the active pattern 120 may be formed through the interlayer insulating layer 150 and the gate insulating layer 130 by the photolithography process and/or the like.

Then, the active pattern 120 may be subject to the heat treatment. For example, heat HEAT at about 450° C. may be provided to the active pattern 120 through a heat source outside the display substrate. In this case, impurities may be discharged from the heat-treated active pattern 120 through the contact hole, and a driving range of the thin film transistor may be adjusted, so that characteristics of the thin film transistor may be improved.

In a comparative example, when the gate wire GW includes a lower metal layer instead of the metal oxide layers 141a and 141b, in a heat treatment process of the active pattern 120, a material constituting the upper metal layers 142a and 142b may diffuse downward to react with the lower metal layer so that an intermetallic compound layer may be formed. For example, when the lower metal layer includes titanium, copper may diffuse into the lower metal layer so that a copper-titanium alloy ($Cu_3Ti$) may be formed. The intermetallic compound layer may be easily formed in a high-temperature environment such as the heat treatment process. When the lower metal layer is converted into the intermetallic compound layer as described above, a resistance of the gate wire GW may be increased. In this case, transmission of the gate signal transmitted through the gate wire GW may be reduced or delayed.

However, in one embodiment of the present disclosure, because the gate wire GW includes the metal oxide layers 141a and 141b, the intermetallic compound layer may not be formed in the heat treatment process of the active pattern 120, and an increase in the resistance of the gate wire GW may be prevented or reduced.

Referring to FIGS. 1 and 2, after the data wire DW and the drain electrode 162 are formed, the pixel electrode 180 coupled to the drain electrode 162 may be formed.

First, the data wire DW and the drain electrode 162 may be formed on the interlayer insulating layer 150. For example, the data wire DW and the drain electrode 162 may be formed by depositing a conductive layer on the interlayer insulating film 150 through the sputtering and/or the like, and partially etching the conductive layer through the photolithography process and/or the like. In addition, the protective layer 170 may be formed on the interlayer insulating layer 150 to cover the data wire DW and the drain electrode 162.

Thereafter, the pixel electrode 180 may be formed on the protective layer 170. For example, the pixel electrode 180 may be formed by depositing a conductive layer on the protective layer 170 through the sputtering and/or the like, and partially etching the conductive layer through the photolithography process and/or the like. In addition, the pixel defining layer 190 may be formed on the protective layer 170 to cover the periphery of the pixel electrode 180.

Hereinafter, a configuration of a display substrate according to another embodiment of the present disclosure will be described with reference to FIGS. 1 and 9.

Figure 9:
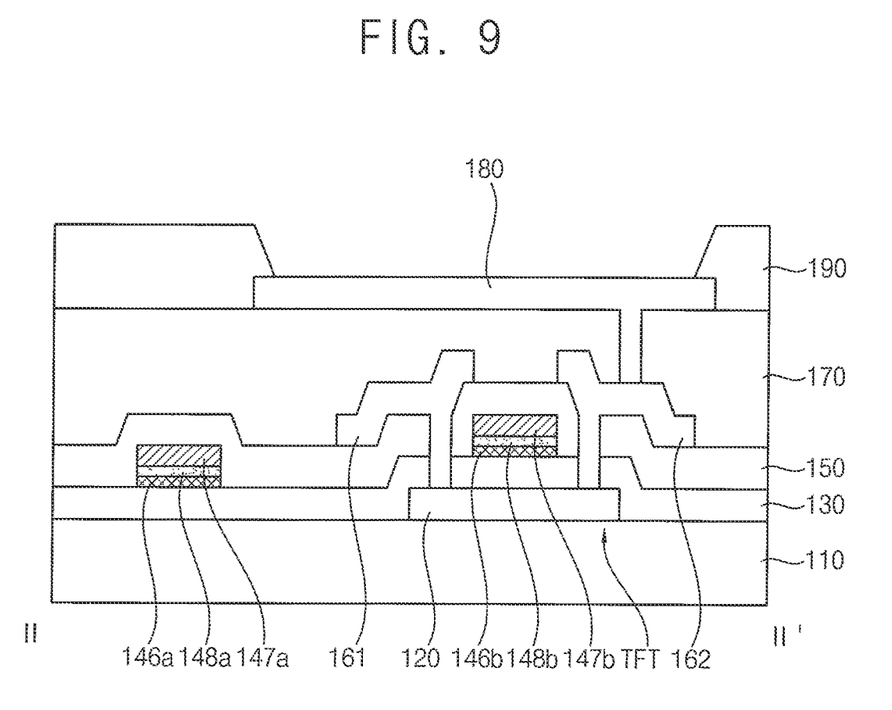
FIG. 9 is a cross-sectional view showing a display substrate according to another embodiment of the present disclosure.

FIG. 9 is a cross-sectional view showing a display substrate according to another embodiment of the present disclosure. For example, FIG. 9 may be a cross-sectional view taken along line II-II' of the display substrate of FIG. 1.

Referring to FIGS. 1 and 9, according to another embodiment of the present disclosure, a display substrate may include a substrate 110, a thin film transistor TFT and wirings such as a gate wire GW and a data wire on the substrate 110, and a pixel electrode 180 coupled to the thin film transistor TFT. In the display substrate according to another embodiment of the present disclosure that will be described with reference to FIG. 9, duplicative descriptions of components that are substantially identical or similar to the components of the display substrate according to one embodiment of the present disclosure described with reference to FIG. 2 will not be repeated here.

The gate wire GW may include metal oxide layers 146a and 146b, metal layers 147a and 147b over the metal oxide layers 146a and 146b, and intermetallic compound layers 148a and 148b between the metal oxide layers 146a and 146b and the metal layers 147a and 147b.

The metal oxide layers 146a and 146b may include at least one oxide selected from tantalum, niobium, and titanium. For example, the metal oxide layers 146a and 146b may include tantalum pentoxide, niobium pentoxide, and/or titanium dioxide. The metal layers 147a and 147b may include a metal having a low resistance, such as copper. The intermetallic compound layers 148a and 148b may include an intermetallic compound including at least one selected from tantalum, niobium, and/or titanium, and copper.

Hereinafter, a wiring structure of the display substrate according to another embodiment of the present disclosure will be described with reference to FIG. 10.

Figure 10:
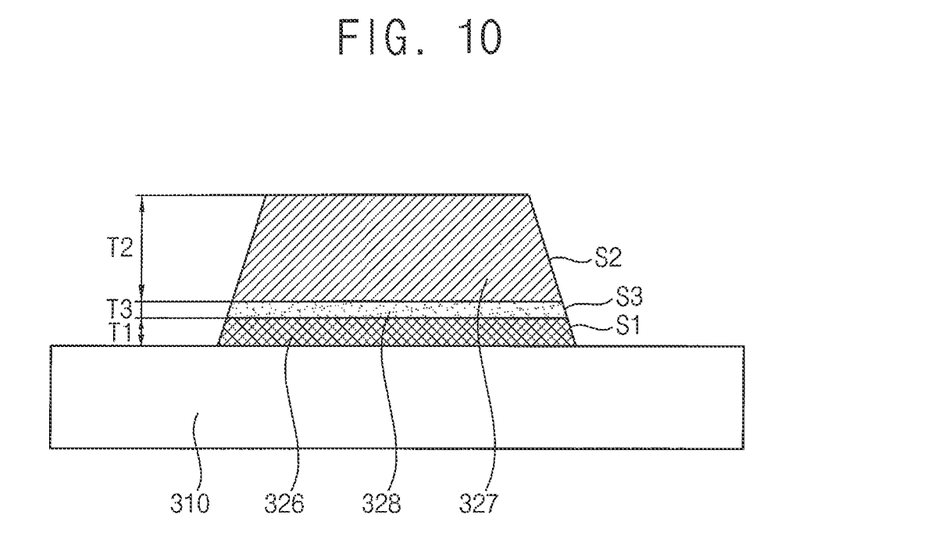
FIG. 10 is a cross-sectional view showing a wiring of the display substrate according to another embodiment of the present disclosure.

FIG. 10 is a cross-sectional view showing a wiring of the display substrate according to another embodiment of the present disclosure. For example, the wiring of FIG. 10 may represent the gate wire GW of the display substrate according to another embodiment of the present disclosure shown in FIGS. 1 and 9.

Referring to FIG. 10, as described above, according to another embodiment of the present disclosure, the gate wire GW of the display substrate may include a metal oxide layer 326, an intermetallic compound layer 328, and a metal layer 327 that are sequentially stacked on a base layer 310. The base layer 310 may be the substrate 110 or the gate insulating layer 130 in FIG. 9.

The intermetallic compound layer 328 may be interposed between the metal oxide layer 326 and the metal layer 327. In other words, a bottom surface of the intermetallic compound layer 328 may make contact (e.g., physical contact) with a top surface of the metal oxide layer 326, and a top surface of the intermetallic compound layer 328 may make contact (e.g., physical contact) with a bottom surface of the metal layer 327.

A side surface S1 of the metal oxide layer 326, a side surface S3 of the intermetallic oxide layer 328, and a side surface S2 of the metal layer 327 may be continuously formed. In other words, the side surface S1 of the metal oxide layer 326, the side surface S3 of the intermetallic oxide layer 328, and the side surface S2 of the metal layer 327 may extend toward the base layer 310 without a step therebetween.

A thickness T3 of the intermetallic compound layer 328 may be less than or equal to about 30 Å. When the thickness T3 of the intermetallic compound layer 328 is greater than about 30 Å, the resistance of the gate wire GW may be increased due to the intermetallic compound layer 328 having a relatively high resistance.

Hereinafter, a method for manufacturing a display substrate according to another embodiment of the present disclosure will be described with reference to FIGS. 11 to 14 and FIGS. 1 and 9 described above.

FIGS. 11, 12, 13, and 14 are cross-sectional views showing a method for manufacturing a display substrate according to another embodiment of the present disclosure.

In a method for manufacturing a display substrate according to another embodiment of the present disclosure that will be described with reference to FIGS. 11 to 14, duplicative descriptions of components that are substantially identical or similar to the components of the method for manufacturing the display substrate according to one embodiment of the present disclosure described with reference to FIGS. 4 to 8 will not be repeated here.

Figure 11:
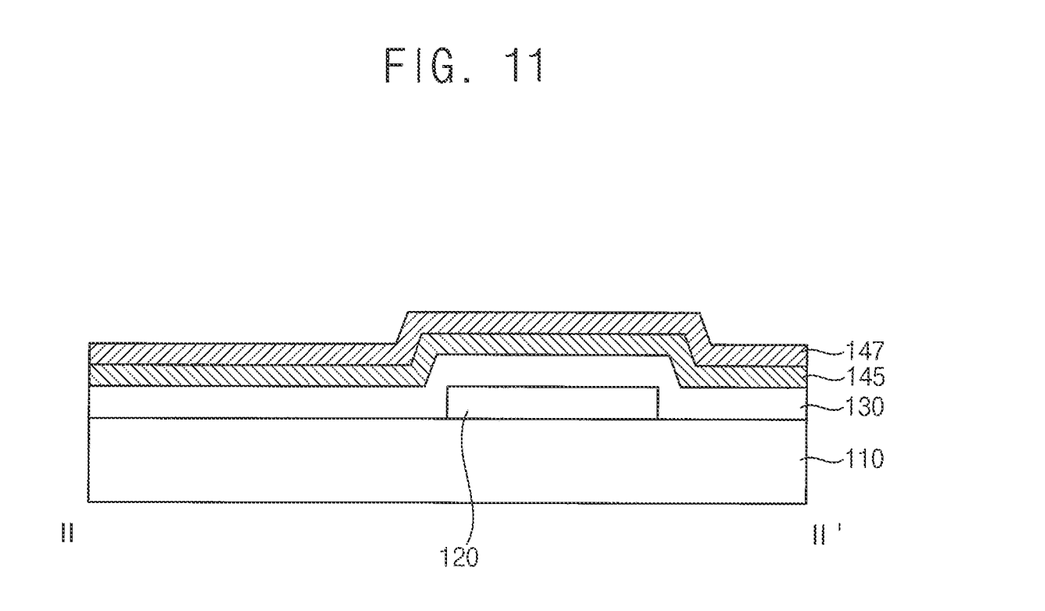
FIGS. 11, 12, 13, and 14 are cross-sectional views showing a method for manufacturing a display substrate according to another embodiment of the present disclosure.

Referring to FIG. 11, a first metal layer 145 and a second metal layer 147 may be sequentially stacked on the substrate 110.

The first metal layer 145 may be formed on the gate insulating layer 130, and the second metal layer 147 may be formed on the first metal layer 145. For example, the first metal layer 145 including at least one selected from tantalum, niobium, and titanium may be deposited on the gate insulating layer 130 through the sputtering and/or the like, and the second metal layer 147 including copper may be deposited on the first metal layer 145 through the sputtering and/or the like.

A thickness of the first metal layer 145 may be in a range of about 50 Å to about 80 Å. Because the thickness of the first metal layer 145 is greater than or equal to about 50 Å, downward diffusion of a material of the second metal layer 147 may be sufficiently prevented or reduced. In addition, a thickness of the second metal layer 147 may be in a range of about 500 Å to about 5000 Å. As described above, because the thickness of the second metal layer 147 is greater than or equal to about 500 Å, the second metal layer 147 may have a relatively low resistance. Because the thickness of the second metal layer 147 is less than or equal to about 5000 Å, deterioration of a step coverage of an insulating layer formed on the second metal layer 147 in a subsequent process may be prevented or reduced.

Figure 12:
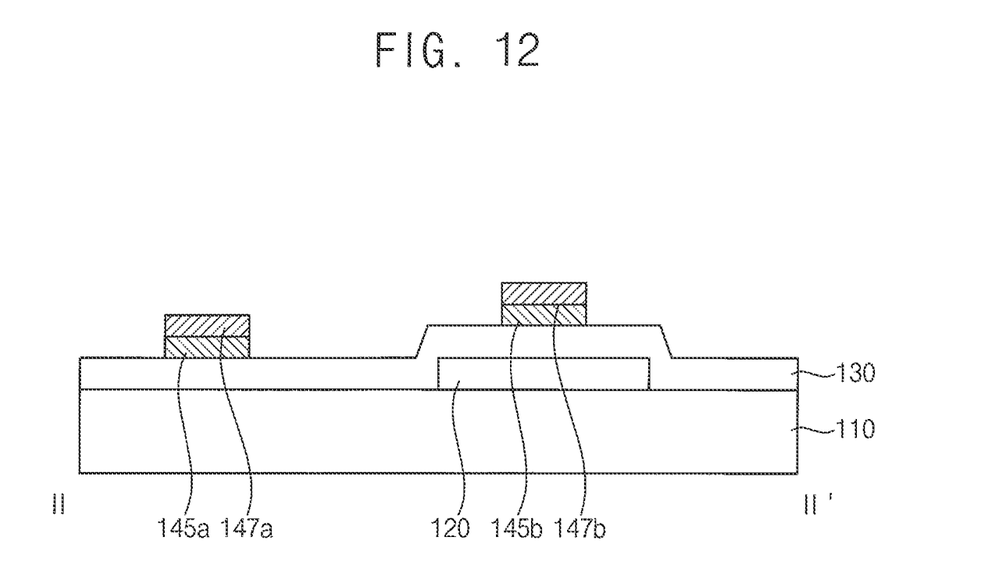

Referring to FIGS. 1 and 12, the gate wire GW may be formed by partially etching the first metal layer 145 together with the second metal layer 147. For example, the first metal layer 145 and the second metal layer 147 may be partially etched through the photolithography process and/or the like using the wet etching. The gate wire GW may include lower metal layers 145a and 145b obtained by partially etching the first metal layer 145, and upper metal layers 147a and 147b obtained by partially etching the second metal layer 147. Because the first metal layer 145 is partially etched together with the second metal layer 147, side surfaces of the upper metal layers 147a and 147b may be consecutive to (e.g., aligned with) side surfaces of the lower metal layers 145a and 145b, respectively.

Figure 13:
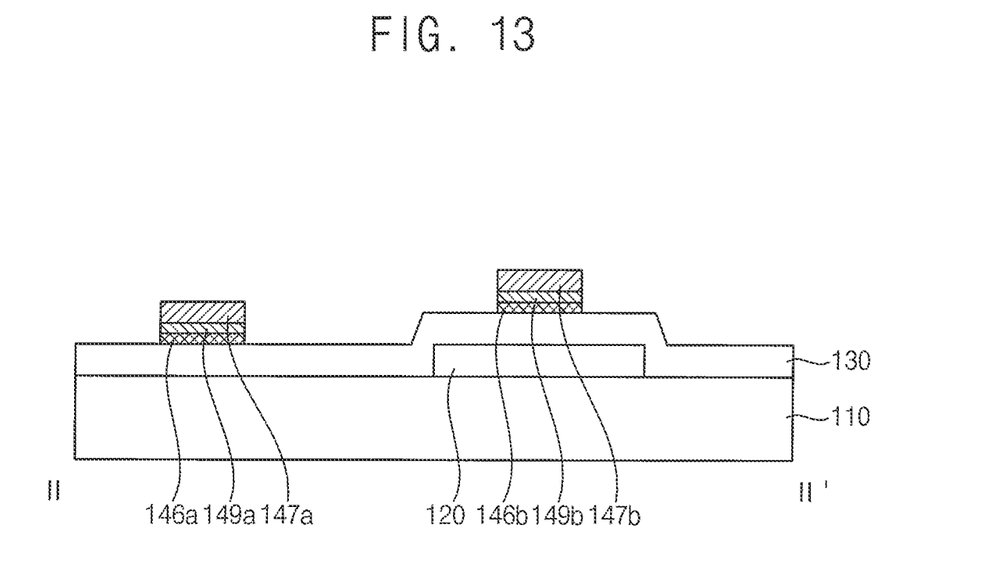

Referring to FIG. 13, the lower metal layers 145a and 145b may be at least partially converted into the metal oxide layers 146a and 146b through oxidation.

In one embodiment, the lower metal layers 145a and 145b may be at least partially converted into the metal oxide layers 146a and 146b through natural oxidation. For example, when oxygen and/or moisture included in the substrate 110 and/or the gate insulating layer 130 are introduced into the lower metal layers 145a and 145b, the lower metal layers 145a and 145b may be at least partially converted into the metal oxide layers 146a and 146b due to the oxygen and/or the moisture. Accordingly, an additional process for at least partially oxidizing the lower metal layers 145a and 145b may not be required.

In one embodiment, the lower metal layers 145a and 145b may be partially converted into the metal oxide layers 146a and 146b through the oxidation. The lower metal layers 145a and 145b may be oxidized by the oxygen and/or the moisture included in the substrate 110 and/or the gate insulating layer 130 under the lower metal layers 145a and 145b, and a thickness of each of the oxidized lower metal layers 145a and 145b may be less than or equal to about 50 Å from a bottom surface of each of the lower metal layers 145a and 145b. As described above, because the thickness of the first metal layer 145 is in a range of about 50 Å to about 80 Å, lower portions of the lower metal layers 145a and 145b having a thickness of about 50 Å or less from the bottom surfaces of the lower metal layers 145a and 145b may be converted into the metal oxide layers 146a and 146b through the oxidation, respectively.

Remaining parts of the lower metal layers 145a and 145b may not be oxidized, and may remain as intermediate metal layers 149a and 149b, respectively. In this case, upper portions of the lower metal layers 145a and 145b having a thickness of about 30 Å or less from top surfaces of the lower metal layers 145a and 145b may not be oxidized, and may remain as the intermediate metal layers 149a and 149b, respectively.

Figure 14:
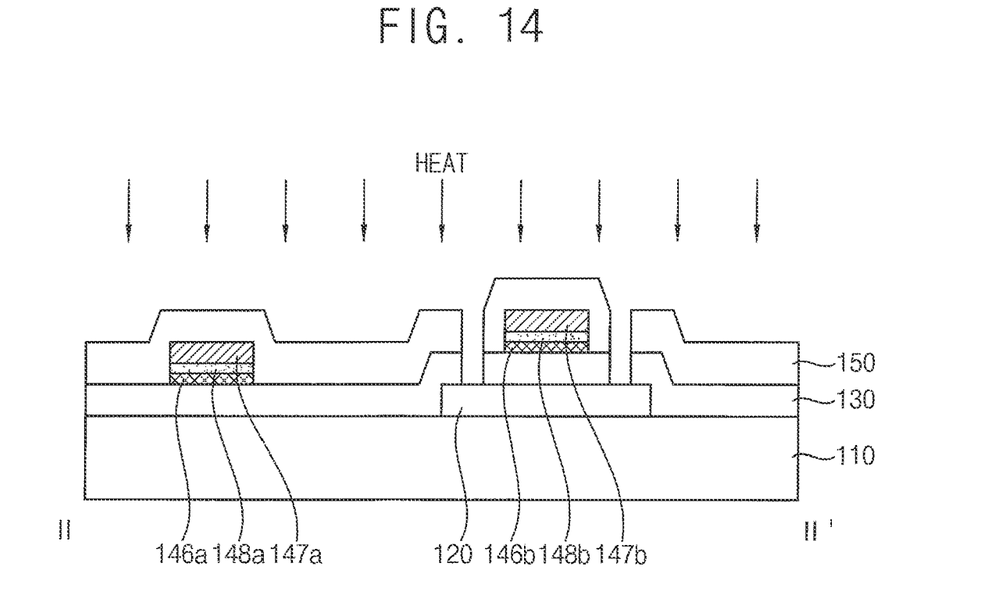

Referring to FIG. 14, after the lower metal layers 145a and 145b are partially converted into the metal oxide layers 146a and 146b through the oxidation, the active pattern 120 may be subject to the heat treatment.

In the heat treatment process of the active pattern 120, a material constituting the upper metal layers 147a and 147b may diffuse downward to react with the intermediate metal layers 149a and 149b so that the intermediate metal layers 149a and 149b may be converted into the intermetallic compound layers 148a and 148b. For example, when the intermediate metal layers 149a and 149b includes titanium, copper may diffuse into the intermediate metal layers 149a and 149b so that a copper-titanium alloy may be formed.

In one embodiment, a thickness of each of the intermetallic compound layers 148a and 148b may be less than or equal to about 30 Å. Although resistances of the intermetallic compound layers 148a and 148b may be relatively large as compared with the intermediate metal layers 149a and 149b, because each of the intermetallic compound layers 148a and 148b has a relatively small thickness of about 30 Å or less, an influence on the resistance of the gate wire GW may not be significant.

Hereinafter, a configuration of a display device according to one embodiment of the present disclosure will be described with reference to FIG. 15.

Figure 15:
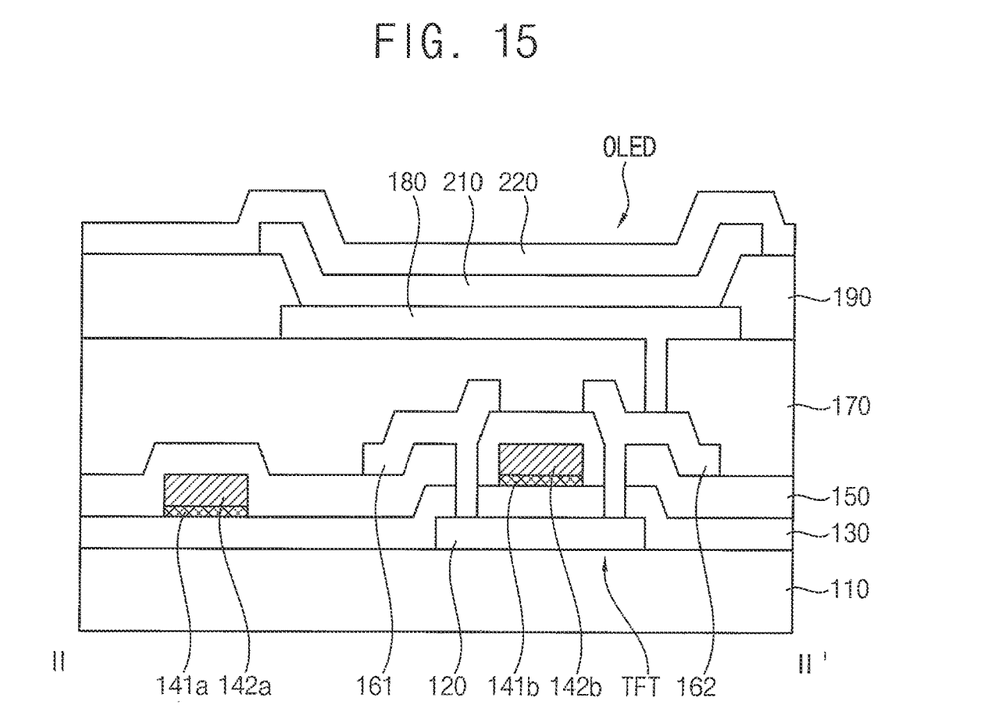
FIG. 15 is a cross-sectional view showing a display device according to one embodiment of the present disclosure.

FIG. 15 is a cross-sectional view showing a display device according to one embodiment of the present disclosure. For example, FIG. 15 shows an organic light emitting display device including the display substrate according to one embodiment of the present disclosure described with reference to FIG. 2. However, the present disclosure is not limited thereto, and the display device may include the display substrate according to another embodiment of the present disclosure described with reference to FIG. 9.

Referring to FIG. 15, according to one embodiment of the present disclosure, the display device may include an organic light emitting layer 210 and a counter electrode 220 that are sequentially on the display substrate according to one embodiment of the present disclosure. Duplicative descriptions of the configuration of the display substrate described with reference to FIG. 2 will not be repeated here.

The organic light emitting layer 210 may be on the pixel electrode 180 and the pixel defining layer 190. The organic light emitting layer 210 may be independently patterned for each pixel to generate different color lights for each pixel. The organic light emitting layer 210 may include a host material excited by holes and electrons, and a dopant material that increases luminous efficiency through absorption and emission of energy.

In one embodiment, as shown in FIG. 15, the organic light emitting layer 210 may be formed on a side wall of the pixel defining layer 190 and a top surface of the pixel electrode 180 exposed by the pixel defining layer 190, and may partially extend onto a top surface of the pixel defining layer 190. In another embodiment, the organic light emitting layer 210 may be defined by the side wall of the pixel defining layer 190, and may be independently included for each pixel.

In one embodiment, a hole transport layer (HTL) may be between the pixel electrode 180 and the organic light emitting layer 210. In addition, an electron transport layer (ETL) may be between the organic light emitting layer 210 and the counter electrode 220. The hole transport layer and/or the electron transport layer may be continuously and commonly provided in a plurality of pixels.

The hole transport layer may include a hole transport material such as 4,4'-bis[N-(1-naphthyl)-N-phenylamino]biphenyl (NPB), 4,4'-bis[N-(3-methylphenyl)-N-phenylamino]biphenyl (TPD), N,N-di-1-naphthyl-N,N-diphenyl-1,1-biphenyl-4,4-diamine (NPD), N-phenylcarbazole, and polyvinyl carbazole. In addition, the electron transport layer may include an electron transport material such as tris(8-quinolinolato)aluminum (Alq3), 2-(4-biphenylyl)-5-(4-tert-butylphenyl-1,3,4-oxydiazole (PBD), bis(2-methyl-8-quinolinolato)-4-phenylphenolato-aluminum (BAlq), bathocuproine (BCP), triazole (TAZ), and phenylquinoxaline.

The counter electrode 220 may be on the organic light emitting layer 210 and the pixel defining layer 190. The counter electrode 220 may face the pixel electrode 180 with the organic light emitting layer 210 interposed therebetween. The counter electrode 220 may include a metal having a low work function, such as Al, Ag, W, Cu, Ni, Cr, Mo, Ti, Pt, Ta, Nb, and/or Sc, and/or an alloy of the metal. In one embodiment, the counter electrode 220 may be commonly in a plurality of pixels.

A light emitting element OLED may be defined by the pixel electrode 180, the organic light emitting layer 210, and the counter electrode 220 described above. The pixel electrode 180 and the counter electrode 220 may be provided as an anode and a cathode of the light emitting element OLED, respectively.

The display substrate according to the embodiments of the present disclosure may be applied to a display device included in a computer, a notebook, a mobile phone, a smartphone, a smart pad, a PMP, a PDA, an MP3 player, and/or the like.

Although the display substrates, the methods of manufacturing the display substrates, and the display devices including the display substrate according to the embodiments of the present disclosure have been described with reference to the drawings, the illustrated embodiments are examples, and may be modified and changed by a person having ordinary knowledge in the relevant technical field without departing from the technical spirit of the present disclosure described in the following claims, and equivalents thereof.

THE DESCRIPTION OF AT LEAST SOME OF THE REFERENCE NUMERALS

110: substrate
120: active pattern
140: gate electrode
141a, 141b, 146a, 146b: metal oxide layer
142a, 142b, 147a, 147b: metal layer
148a, 148b: intermetallic compound layer
GW: gate wire
TFT: thin film transistor
OLED: light emitting element

The invention claimed is:

1. A display substrate comprising:
a substrate;
a gate insulating layer on the substrate, the gate insulating layer comprising at least one selected from silicon oxide, silicon nitride, and silicon oxynitride; and
a wiring on the gate insulating layer,
wherein the wiring comprises a metal oxide layer comprising at least one oxide selected from tantalum (Ta), niobium (Nb), and titanium (Ti), a metal layer on the metal oxide layer and comprising copper (Cu), and an intermetallic compound layer between the metal oxide layer and the metal layer, the intermetallic compound layer comprises an intermetallic compound comprising copper, and at least one selected from tantalum, niobium, or titanium, and
a thickness of the metal oxide layer is in a range of 30 angstroms (Å) to 50 Å.

2. The display substrate of claim 1, wherein a thickness of the intermetallic compound layer is less than or equal to 30 Å.

3. The display substrate of claim 1, wherein a side surface of the metal oxide layer, a side surface of the intermetallic compound layer, and a side surface of the metal layer are continuously formed.

4. The display substrate of claim 1, wherein a thickness of the metal layer is in a range of 500 Å to 5000 Å.

5. The display substrate of claim 1, wherein the substrate comprises silicon oxide ($SiO_x$).

6. A method for manufacturing a display substrate, the method comprising:
   forming a gate insulating layer on a substrate, the gate insulating layer comprising at least one selected from silicon oxide, silicon nitride, and silicon oxynitride;
   sequentially stacking a first metal layer comprising at least one selected from tantalum (Ta), niobium (Nb), and titanium (Ti) and a second metal layer comprising copper (Cu) on the gate insulating layer;
   forming a wiring by partially etching the first metal layer and the second metal layer; and
   converting the first metal layer into a metal oxide layer by oxidation.

7. The method of claim 6, wherein the first metal layer is converted into the metal oxide layer by natural oxidation.

8. The method of claim 6, wherein a thickness of the metal oxide layer is in a range of 30 angstroms (Å) to 50 Å.

9. The method of claim 6, wherein the first metal layer is entirely converted into the metal oxide layer by the oxidation.

10. The method of claim 6, wherein the first metal layer is partially converted into the metal oxide layer by the oxidation.

11. The method of claim 10, further comprising converting a remaining part of the first metal layer, which is not oxidized, into an intermetallic compound layer by allowing the remaining part of the first metal layer to react with the second metal layer.

12. The method of claim 11, wherein a thickness of the intermetallic compound layer is less than or equal to 30 Å.

13. The method of claim 11, wherein the converting of the remaining part of the first metal layer, which is not oxidized, into the intermetallic compound layer is performed after the first metal layer is partially converted into the metal oxide layer by the oxidation.

14. A display device comprising:
   a substrate;
   a gate insulating layer on the substrate, the gate insulating layer comprising at least one selected from silicon oxide, silicon nitride, and silicon oxynitride;
   a gate wire on the gate insulating layer;
   a thin film transistor comprising an active pattern, and a gate electrode overlapping the active pattern and protruding from the gate wire; and
   a light emitting element coupled to the thin film transistor,
   wherein the gate wire comprises a metal oxide layer comprising at least one oxide selected from tantalum (Ta), niobium (Nb), and titanium (Ti), and a metal layer on the metal oxide layer and comprising copper (Cu), and an intermetallic compound layer between the metal oxide layer and the metal layer, the intermetallic compound layer comprises an intermetallic compound comprising copper, and at least one selected from tantalum, niobium, or titanium, and
   a thickness of the metal oxide layer is in a range of 30 angstroms (Å) to 50 Å.

* * * * *